(12) United States Patent
Balachandran et al.

(10) Patent No.: US 9,116,164 B2
(45) Date of Patent: Aug. 25, 2015

(54) PSEUDO-DIFFERENTIAL ACCELEROMETER WITH HIGH ELECTROMAGNETIC INTERFERENCE REJECTION

(71) Applicant: Robert Bosch GmbH, Stuttgart (DE)

(72) Inventors: Ganesh Balachandran, Sunnyvale, CA (US); Vladimir Petkov, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 336 days.

(21) Appl. No.: 13/788,709

(22) Filed: Mar. 7, 2013

(65) Prior Publication Data

US 2014/0251012 A1 Sep. 11, 2014

(51) Int. Cl.
*G01P 15/125* (2006.01)
*G01L 1/14* (2006.01)
*G01D 5/241* (2006.01)
*G01P 15/08* (2006.01)

(52) U.S. Cl.
CPC ............ *G01P 15/125* (2013.01); *G01D 5/2417* (2013.01); *G01L 1/144* (2013.01); *G01P 15/0802* (2013.01); *H01L 2224/05554* (2013.01); *H01L 2224/48137* (2013.01)

(58) Field of Classification Search
CPC ........ G01P 15/125; G01L 1/144; G01R 27/26
USPC ........................................ 324/679; 73/514.32
See application file for complete search history.

(56) References Cited

U.S. PATENT DOCUMENTS

| | | | | |
|---|---|---|---|---|
| 5,724,000 A * | 3/1998 | Quinn | ........................ | 327/554 |
| 5,739,720 A * | 4/1998 | Lee | ................................ | 330/9 |
| 5,914,638 A * | 6/1999 | He | ............................... | 330/258 |
| 7,786,738 B2 * | 8/2010 | Lang et al. | .................... | 324/686 |
| 8,536,881 B2 * | 9/2013 | Lin et al. | ........................ | 324/679 |
| 8,854,057 B2 * | 10/2014 | Balachandran et al. | ...... | 324/672 |
| 8,854,062 B2 * | 10/2014 | Petkov et al. | ................. | 324/679 |
| 8,860,440 B2 * | 10/2014 | Balachandran et al. | ...... | 324/672 |
| 2005/0218911 A1 * | 10/2005 | Denison | ........................ | 324/661 |
| 2013/0049776 A1 * | 2/2013 | Petkov et al. | ................. | 324/679 |

* cited by examiner

*Primary Examiner* — Jeff Natalin
(74) *Attorney, Agent, or Firm* — Maginot Moore & Beck LLP

(57) ABSTRACT

A pseudo-differential accelerometer resistant to EMI is disclosed that includes a device with a sensor core connected to an integrated circuit including a chopper, differential amplifier, and dummy core. The chopper swaps input to output connections during different states. The dummy core is coupled to a dummy chopper input. Three bond wires coupling the sensor output to a sensor chopper input, a first chopper output to a first sensor input, and a second chopper output to a second sensor input can connect the sensor and integrated circuit. The device can include a dummy pad and dummy bond wire connecting the dummy pad to the dummy chopper input. This configuration requires four bond wires connecting the sensor and integrated circuit. A neutralization core can be connected to the sensor chopper input. The chopper can change states to smear noise across a wide range, or away from a band of interest.

20 Claims, 11 Drawing Sheets

PSEUDO-DIFFERENTIAL ACCELEROMETER WITH HIGH ELECTROMAGNETIC INTERFERENCE REJECTION

BACKGROUND OF THE INVENTION

This patent relates to capacitive transducers, and more particularly to techniques for overcoming electromagnetic interference in capacitive sensors.

In inertial sensors, electromagnetic disturbance or interference (EMI) occurs primarily due to capacitive coupling between bond wires and nearby cables, plates, circuitry, etc. FIG. 1 illustrates an exemplary scenario of EMI. In FIG. 1, a microelectromechanical structure (MEMS) device 102 is coupled to an application specific integrated circuit (ASIC) 104 by a plurality of bond wires 106. A source of EMI 110 that is near the bond wires 106 creates capacitive coupling 112 between the EMI source 110 and the bond wires 106. Capacitor symbols are shown in FIG. 1 to illustrate the capacitive coupling 112, but this simply illustrates the parasitic capacitance between the electromagnetic disturbance source 110 and the bond wires 106, no actual electrical component is present. The bond wires coupling capacitive nodes are the most sensitive to EMI, as opposed to nodes driven by a voltage source or amplifier.

In environments with a high density of electronics, there can be numerous sources of EMI, and these EMI sources can be significant. The electromagnetic disturbances can also occur at substantially a single frequency, which upon sampling can get folded into a DC component. These electromagnetic disturbances can land on top of a desired sensor signal and obliterate the desired signal. For example, if a desired signal is sampled at a 100 kHz clock frequency, and the disturbance is at 100 kHz, then when sampling the disturbance at the clock frequency it can appear as a substantially DC signal. Thus, it is important to protect desired sensor signals, especially along capacitive paths, from EMI. The EMI problem is especially important to solve in safety critical applications that are in harsh environments, for example the sensors used for electronic stability in an automobile.

Two commonly used solutions to EMI are shielding the sensor with metal, and using a differential approach. Shielding the sensor with metal includes creating a Faraday cage to block external electric fields which can cause EMI. However, shielding can be bulky and expensive, especially when there are numerous sensors to be shielded.

The differential approach takes the differences between signals on parallel wires which can substantially subtract out the electromagnetic disturbance as a common mode signal. FIG. 2 illustrates the differential approach with an exemplary differential sensor and amplifier system 200 that includes a MEMS device 220 coupled to an ASIC 240 by bond wires 260, 262. Each of the bond wires 260, 262 experiences EMI from external EMI sources 210. Capacitive coupling 250 between the EMI source 210 and the first bond wire 260 creates a first disturbance capacitance C1, and capacitive coupling 252 between the EMI source 210 and the second bond wire 262 creates a second disturbance capacitance C2. If the disturbance capacitances C1 and C2 between the EMI sources 210 and the bond wires 260, 262 are the same, then the electromagnetic disturbance can be rejected due to the common mode rejection of the differential amplifier of the ASIC 240. However, in order to achieve the desired cancellation, the disturbance capacitances C1 and C2 between the EMI sources 210 and the bond wires 260, 262 should be closely matched, for example a difference of less than 0.5%. This matching can be very difficult to achieve in practice. Even if the matching is achieved initially, bond wires can be disturbed or warped, for example by an automobile accident. This movement of the bond wires can cause asymmetry between the bond wires, which can cause an unwanted mismatch in the disturbance capacitances and reduce the effectiveness of the differential approach. For this reason additional techniques can be used to smear the EMI energy over a wide frequency range.

Accelerometers are often implemented in harsh vibration-ridden environments, for example automotive or industrial environments. In these environments, it is desirable to have accelerometers with good linearity, low drift performance and large full scale range. Self-balanced accelerometers are usually chosen for these applications. In self-balanced accelerometers, the capacitance C is proportional to 1/d, where d is the distance between the capacitive plates; and the measured output voltage $V_0$ is proportional to $(C_1-C_2)/(C_1+C_2)$. Combining these two relationships provides:

$$V_0 \propto \frac{C_1 - C_2}{C_1 + C_2} = \frac{\frac{1}{d1} - \frac{1}{d2}}{\frac{1}{d1} + \frac{1}{d2}} = \frac{d2 - d1}{d2 + d1} = \frac{x}{d0} \quad (1)$$

where x is the displacement value, d0 is the zero displacement value, d1=d0−x is the distance between the plates of capacitor $C_1$, and d2=d0+x is the distance between the plates of capacitor $C_2$. Equation (1) shows that in the ideal case the output voltage $V_0$ of the self-balanced accelerometer is a linear function of the displacement x. Unfortunately, in actual implementations, there are sources of non-linearity not taken into account in Eq. (1).

Though there are several ways to build self-balanced accelerometers to obtain a reading that is proportional to the displacement of the proof mass, to achieve a highly linear accelerometer it is desirable to have a topology that results in zero residual force upon the application of sensor excitation voltages. There are two main sources of non-linearity in self-balanced accelerometers: feed-through capacitance, and mismatch between the two sensor cores. The dominant source is feed-through capacitance, and it is present in both single ended (using only one core) and differential (using two cores) topologies. Feed-through capacitance (Cft) is any fixed capacitance between the proof mass and the sense electrodes. The feed-through capacitances Cft arise due to parasitics in the sensor element and due to capacitance between the bond wires.

To achieve robustness to EMI and spurious vibration, a fully differential accelerometer is typically used for automotive applications. A fully differential self balanced accelerometer for first-order EMI reduction typically has two capacitive cores as described below with reference to FIG. 3. However, two capacitive cores on a MEMS device coupled by bond wires to an integrated circuit requires numerous bonding pads and bond wires, which requires a relatively large area just for connections. It would be desirable to reduce the number of bonding pads and bond wires to reduce the area needed for connections.

It would be desirable to have a robust technique for reducing electromagnetic interference that also overcomes some of the disadvantages of shielding and differential circuits with reduced connections to reduce the area needed for connections. It would also be desirable to reduce or eliminate the nonlinearity due to feed-through capacitances.

SUMMARY OF THE INVENTION

A pseudo-differential accelerometer resistant to electromagnetic interference is disclosed. The pseudo-differential accelerometer includes a microelectromechanical device connected to an integrated circuit by bond wires. The microelectromechanical device includes a capacitive sensor core having a first sensor core input, a second sensor core input and a sensor core output. The integrated circuit includes a chopper system, a differential amplifier, a dummy core and a reference voltage. The differential amplifier has an inverting input, a non-inverting input and produces an amplifier output voltage. The chopper system has a plurality of chopper inputs and a plurality of chopper outputs, wherein during a chop state 0 the chopper system connects a first set of the plurality of chopper inputs to a first set of the plurality of chopper outputs and during a chop state 1 the chopper system connects a second set of the plurality of chopper inputs to a second set of the plurality of chopper outputs. The dummy core is coupled to a dummy core chopper input of the chopper system. A sensor core bond wire couples the sensor core output of the capacitive sensor core to a sensor core chopper input of the chopper system. A first feedback bond wire couples a first feedback signal to the first sensor core input of the capacitive sensor core, and the first feedback bond wire is coupled to a first chopper feedback output. A second feedback bond wire couples a second feedback signal to the second sensor core input of the capacitive sensor core, and the second feedback bond wire is coupled to a second chopper feedback output. When the chopper system is in the chop state 0, the chopper system connects the sensor core chopper input to the inverting input of the differential amplifier, connects the dummy core chopper input to the non-inverting input of the differential amplifier, connects the first chopper feedback output to a difference of the amplifier output and reference voltages, and connects the second chopper feedback output to a sum of the amplifier output and reference voltages. When the chopper system is in the chop state 1, the chopper system connects the sensor core chopper input to the non-inverting input of the differential amplifier, connects the dummy core chopper input to the inverting input of the differential amplifier, connects the first chopper feedback output to the inverse of the difference of the amplifier output and reference voltages, and connects the second chopper feedback output to the inverse of the sum of the amplifier output and reference voltages. The inverse of the difference of the amplifier output and reference voltages having the same magnitude and opposite polarity as the difference of the amplifier output and reference voltages, and the inverse of the sum of the amplifier output and reference voltages having the same magnitude and opposite polarity as the sum of the amplifier output and reference voltages.

The chopper system can be varied between the chop state 0 and the chop state 1 at frequencies that smear noise away from a frequency band of interest. Alternatively, the chopper system can be varied between the chop state 0 and the chop state 1 at frequencies that smear noise substantially evenly across a wide frequency range.

The dummy core can include a first dummy core input, a second dummy core input and a dummy core output, where the dummy core output is coupled to the dummy core chopper input of the chopper system. When the chopper system is in the chop state 0, the chopper system connects the reference voltage to the first dummy core input, and connects the inverse reference voltage to the second dummy core input. When the chopper system is in the chop state 1, the chopper system connects the inverse reference voltage to the first dummy core input, and connects the reference voltage to the second dummy core input. The inverse reference voltage has the same magnitude and opposite polarity as the reference voltage. The dummy core can include a first dummy capacitor having a first dummy capacitor input and a first dummy capacitor output, and a second dummy capacitor having a second dummy capacitor input and a second dummy capacitor output, where the first dummy capacitor input is the first dummy core input, the second dummy capacitor input is the second dummy core input, and a common node receives the first and second dummy capacitor outputs and is the dummy core output. The dummy core can also include a dummy parasitic capacitor that connects the dummy core output to ground. In this configuration, the pseudo-differential accelerometer only requires the sensor core bond wire, and the first and second feedback bond wires to fully connect the capacitive sensor core of the microelectromechanical device to the integrated circuit.

The microelectromechanical device can also include a dummy pad and a dummy bond wire can connect the dummy pad to the dummy core chopper input. In this configuration, the pseudo-differential accelerometer only requires the sensor core bond wire, the dummy bond wire, and the first and second feedback bond wires to fully connect the capacitive sensor core of the microelectromechanical device to the integrated circuit.

The pseudo-differential accelerometer can also include a neutralization core connected to the sensor core chopper input of the chopper system. A neutralization core is a set of capacitors that are used to cancel the charge injected into the amplifier terminal because of unwanted parasitic capacitances in parallel with the MEMS element. The charge cancellation is done by using an opposite polarity voltage to what is used to excite the sensor. The neutralization core can include a first neutralization core input, a second neutralization core input and a neutralization core output, where the neutralization core output is coupled to the sensor core chopper input of the chopper system. When the chopper system is in the chop state 0, the chopper system connects the first neutralization core input to the inverse of the difference of the amplifier output and reference voltages, and connects the second neutralization core input to the inverse of the sum of the amplifier output and reference voltages. When the chopper system is in the chop state 1, the chopper system connects the first neutralization core input to a difference of the amplifier output and reference voltages, and connects the second neutralization core input to a sum of the amplifier output and reference voltages. The neutralization core can include a first neutralization capacitor having a first neutralization capacitor input and a first neutralization capacitor output, and a second neutralization capacitor having a second neutralization capacitor input and a second neutralization capacitor output, where the first neutralization capacitor input is the first neutralization core input, the second neutralization capacitor input is the second neutralization core input, and a common node receiving the first and second neutralization capacitor outputs is the neutralization core output. The neutralization core can also include a neutralization parasitic capacitor connecting the neutralization core output to ground.

BRIEF DESCRIPTION OF THE DRAWINGS

The above mentioned and other features and objects of this invention, and the manner of attaining them, will become more apparent and the invention itself will be better understood by reference to the following description of embodiments of the invention taken in conjunction with the accompanying drawings, wherein.

Figure 1:
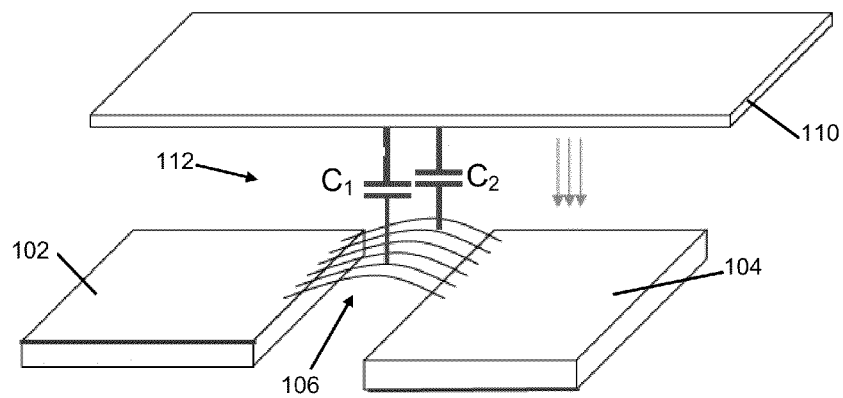
FIG. 1 illustrates electromagnetic disturbance or interference (EMI) due to capacitive coupling between bond wires and nearby cables, plates, circuitry, etc.

Corresponding reference characters indicate corresponding parts throughout the several views. Although the exemplification set out herein illustrates embodiments of the invention, in several forms, the embodiments disclosed below are not intended to be exhaustive or to be construed as limiting the scope of the invention to the precise forms disclosed.

DESCRIPTION OF EXEMPLARY EMBODIMENTS

Figure 3:
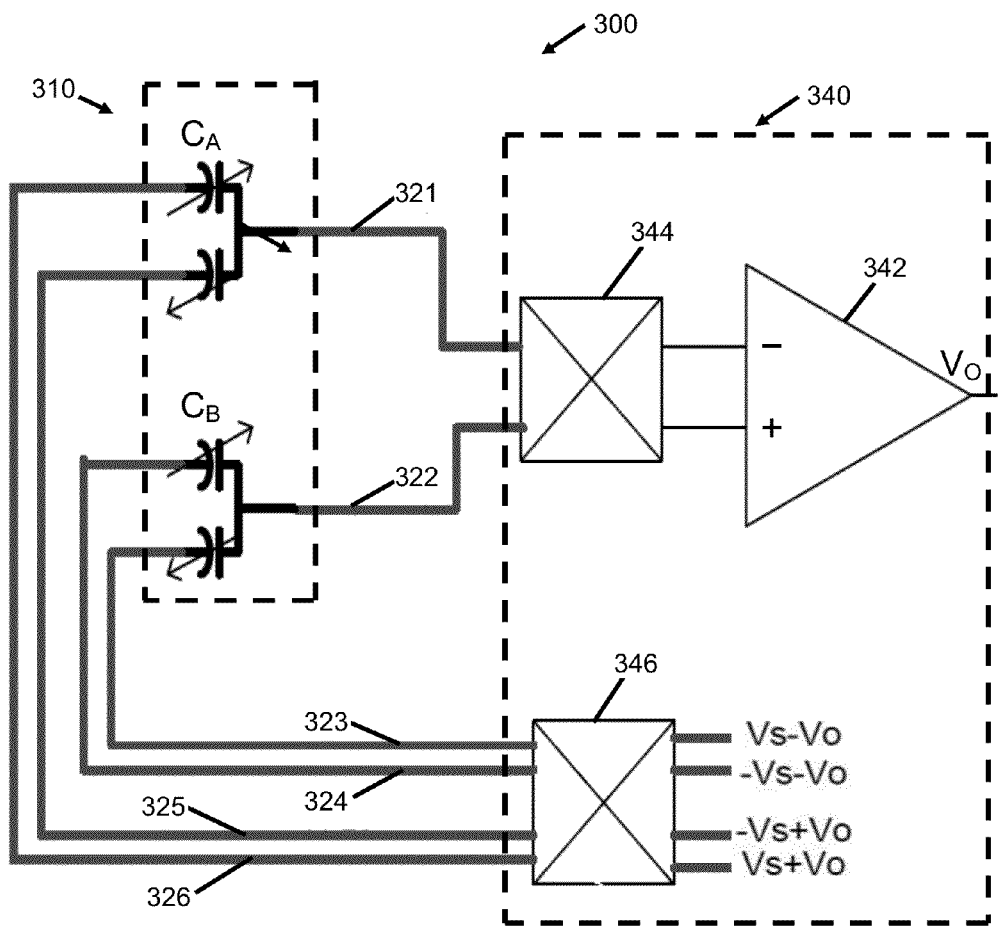
FIG. 3 illustrates an exemplary one-axis fully symmetric differential accelerometer which includes a MEMS device coupled to an ASIC by six bond wires.

FIG. 3 illustrates an exemplary fully symmetric differential accelerometer 300 which includes a MEMS device 310 coupled to an ASIC 340 by six bond wires 321-326. The MEMS device 310 includes two capacitive cores $C_A$ and $C_B$. Each of the capacitive cores $C_A$ and $C_B$ includes two variable capacitors having an input side and an output side, the input sides of the two variable capacitors forming the two inputs to the capacitive core and the output sides of the two variables capacitors being coupled to a common node which forms the single output of the capacitive core.

The ASIC 340 includes a differential amplifier 342, a first chopper system 344 and a second chopper system 346. The differential amplifier 342 has inverting and non-inverting inputs and one or more outputs. The inputs of the first chopper system 344 are coupled to the bond wires 321, 322 which are coupled to the outputs of the two capacitive cores $C_A$, $C_B$, and the outputs of the first chopper system 344 are coupled to the inverting and non-inverting inputs of the differential amplifier 342. The input of the second chopper system 346 are coupled to the ASIC feedback signals, and the outputs of the second chopper system 346 are coupled to the bond wires 323-326 which are coupled to the inputs of the two capacitive cores $C_A$, $C_B$. As shown in the exemplary embodiment of FIG. 3, the ASIC feedback signals can be a combination of the output, $V_O$, of the differential amplifier 342 and a reference voltage, $V_S$.

The first chopper system 344 swaps the connections on its inputs and outputs back and forth such that during one time slice the signal on bond wire 321 is coupled to the inverting input of the differential amplifier 342 and the signal on bond wire 322 is coupled to the non-inverting input of the differential amplifier 342, and during the next time slice the signal on bond wire 321 is coupled to the non-inverting input of the differential amplifier 342 and the signal on bond wire 322 is coupled to the inverting input of the differential amplifier 342. The second chopper system 346 swaps the connections on its inputs and outputs back and forth such that during one time slice the feedback signals with the inverted amplifier output, $V_S-V_O$ and $-V_S-V_O$, are coupled to bond wires 323, 324 which are coupled to the inputs of capacitive core $C_B$ and the feedback signals with the non-inverted amplifier output, $-V_S+V_O$ and $V_S+V_O$, are coupled to bond wires 325, 326 which are coupled to the inputs of capacitive core $C_A$; and during the next time slice the feedback signals with the non-inverted amplifier output, $-V_S+V_O$ and $V_S+V_O$, are coupled to bond wires 323, 324 which are coupled to the inputs of capacitive core $C_B$ and the feedback signals with the inverted amplifier output, $V_S-V_O$ and $-V_S-V_O$, are coupled to bond wires 325, 326 which are coupled to the inputs of capacitive core $C_A$. The chopper systems 344, 346 can swap the bond wire signals according to a pattern to cancel electromagnetic interference from external sources, and maintain a substantially zero average voltage across the sensor capacitors in cores $C_A$ and $C_B$.

Figure 4:
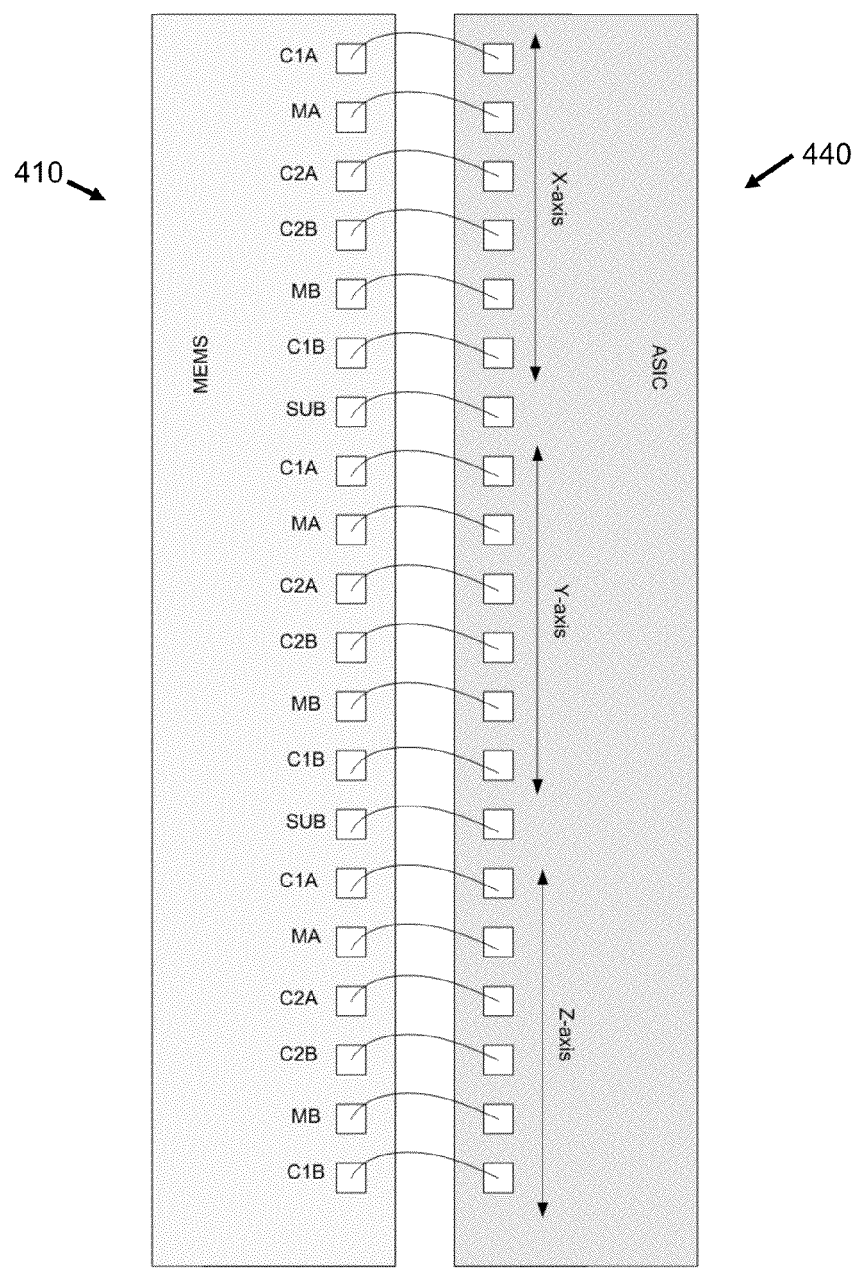
FIG. 4 illustrates the bond wire connections between a MEMS device and an ASIC for a 3-axis (X, Y, Z) fully differential accelerometer.

A fully symmetric differential accelerometer like the exemplary embodiment 300 can significantly reduce electromagnetic interference by common mode rejection but some remnant interference energy may still be present. A random chopping scheme using the chopping systems 344, 346 can be used to push any remnant interference energy to frequencies outside the frequencies of interest to the system. The fully symmetric differential accelerometer 300 also requires two sensor cores per accelerometer. The two sensor cores provide twice the signal (hence twice the signal-to-noise ratio), but also require many bonding pads and bond wires. FIG. 4 illustrates the bond wire connections between a MEMS device 410 and an ASIC 440 for a 3-axis (X, Y, Z) fully differential accelerometer. The illustrated 3-axis fully differential accelerometer requires twenty (20) bonding pads which can significantly add to required chip dimensions.

Figure 5:
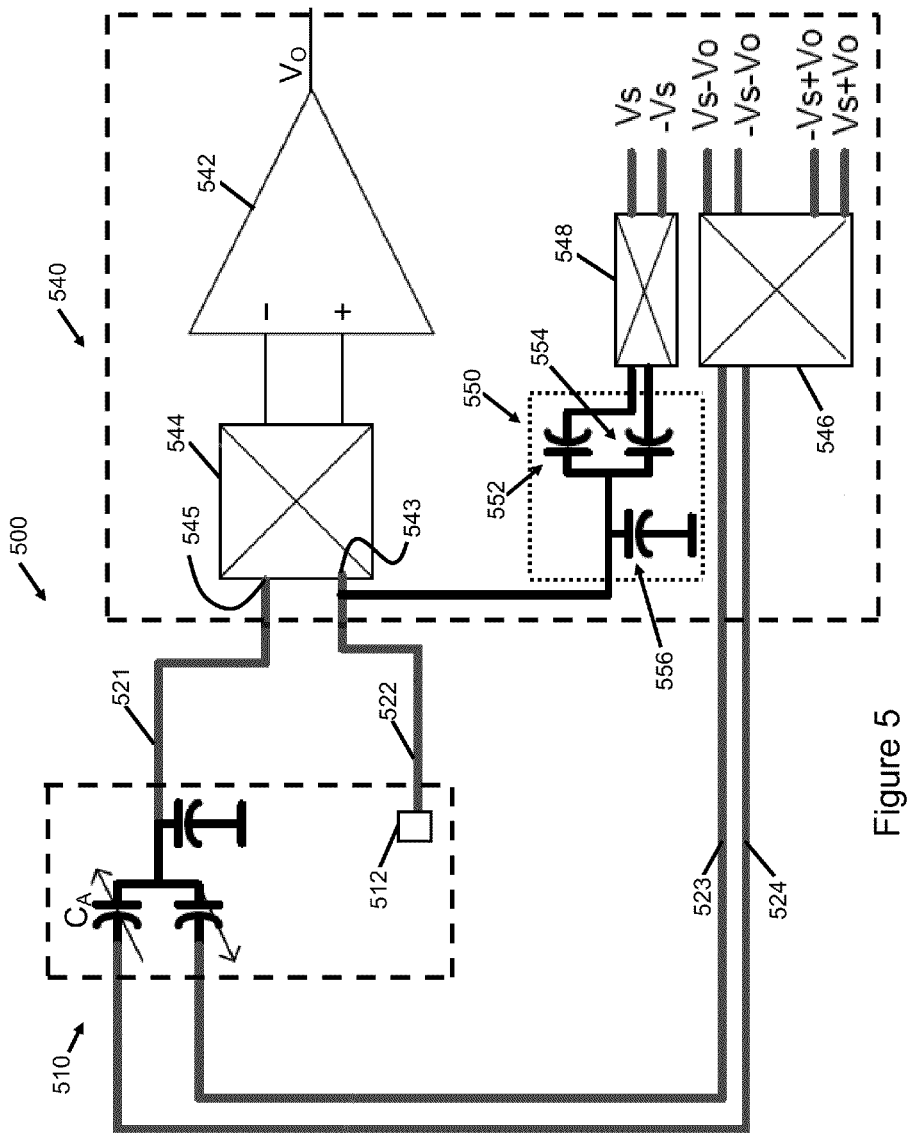
FIG. 5 illustrates an exemplary one-axis pseudo-differential accelerometer which includes a MEMS device coupled to an ASIC by four bond wires where the ASIC includes a dummy sensor core.

The required number of bonding pads for a differential accelerometer can be reduced by using a dummy bonding pad in place of one of the capacitive cores as shown in FIG. 5. FIG. 5 illustrates an exemplary pseudo-differential accelerometer 500 which includes a MEMS device 510 coupled to an ASIC 540 by four bond wires 521-524. The MEMS device 510 includes a single capacitive core $C_A$ and a dummy bond pad 512 which is not coupled to a capacitive core or an active signal generator on the MEMS device 510.

The ASIC 540 includes a differential amplifier 542, a first chopper system 544, a second chopper system 546, a third chopper system 548 and a dummy ASIC sensor 550. The dummy ASIC sensor 550 includes capacitors 552, 554 to mimic a MEMS sensor and a capacitor 556 to mimic parasitic capacitance on the MEMS sensor. The differential amplifier 542 has inverting and non-inverting inputs and one or more outputs. The first chopper system 544 has a dummy core input 543 and a MEMS core input 545. The MEMS core input 545 is coupled to the bond wire 521 which is coupled to the output of the capacitive core $C_A$ of the MEMS device 510. The dummy core input 543 is coupled to the bond wire 522 which is coupled to the dummy bond pad 512 of the MEMS device 510. The dummy core input 543 is also coupled to the output of the dummy ASIC sensor 550. The outputs of the first chopper system 544 are coupled to the inverting and non-inverting inputs of the differential amplifier 542. The inputs of the second chopper system 546 are coupled to the ASIC feedback signals, and the outputs of the second chopper system 546 are coupled to the bond wires 523, 524 which are coupled to the inputs of the capacitive core $C_A$. The inputs of the third chopper system 548 are coupled to a non-inverted and inverted reference voltage, $V_S$ and $-V_S$, the magnitude of the reference voltages being substantially the same and the polarities being opposite. The outputs of the third chopper system 548 are coupled to the inputs of the dummy ASIC sensor 550. As shown in the exemplary embodiment of FIG. 5, the ASIC feedback signals can be a combination of the output voltage, $V_O$, of the differential amplifier 542 and the reference voltage, $V_S$.

In the embodiment of FIG. 5, the core and dummy bond wires 521, 522 connecting the MEMS device 510 and the ASIC 540 are coupled to the inputs 543, 545 of the first chopper system 544. The dummy bond wire 522 is exposed to similar electromagnetic interference as the core bond wire 521 and the signal on the dummy bond wire 522 can be used to help reject the EMI on the core bond wire 521. The dummy input 543 of the first chopper system 544 is also connected to the output of the dummy ASIC core 550 which loosely mimics a sensor core on the MEMS device 510. The first chopper system 544 swaps the connections between the signals at the dummy core input 543 and the MEMS core input 545 and its output signals to the inputs of the differential amplifier 542. During one time slice the first chopper system 544 connects the signal at the MEMS core input 545 to the inverted input of the amplifier 542 and connects the signal at the dummy core input 543 to the non-inverted input of the amplifier 542, and then during the next time slice the first chopper system 544 swaps the connections to connect the signal at the MEMS core input 545 to the non-inverted input of the amplifier 542 and connects the signal at the dummy core input 543 to the inverted input of the amplifier 542.

The second chopper system 546 switches the ASIC feedback signals fed back on the feedback bond wires 523, 524 to the inputs of the capacitive core $C_A$. The feedback signals can be a combination of the output voltage $V_O$ of the differential amplifier 542 and the reference voltage $V_S$. In the embodiment of FIG. 5, during one time slice the second chopper system 546 connects the feedback signals with the inverted amplifier output, $V_S-V_O$ and $-V_S-V_O$, to the feedback bond wires 523, 524, and then during the next time slice the second chopper system 546 swaps the connections to connect the feedback signals with the non-inverted amplifier output, $-V_S+V_O$ and $V_S+V_O$, to the feedback bond wires 523, 524.

The third chopper system 548 switches the dummy feedback signals fed back to the inputs of the dummy ASIC sensor 550. In the embodiment of FIG. 5, during one time slice the third chopper system 548 connects the non-inverted reference voltage, $V_S$, to the dummy sensor capacitor 552 and connects the inverted reference voltage, $-V_S$, to the dummy sensor capacitor 554, and then during the next time slice the third chopper system 548 swaps the connections to connect the inverted reference voltage, $-V_S$, to the dummy sensor capacitor 552 and connect the non-inverted reference voltage, $V_S$, to the dummy sensor capacitor 554.

Figure 6:
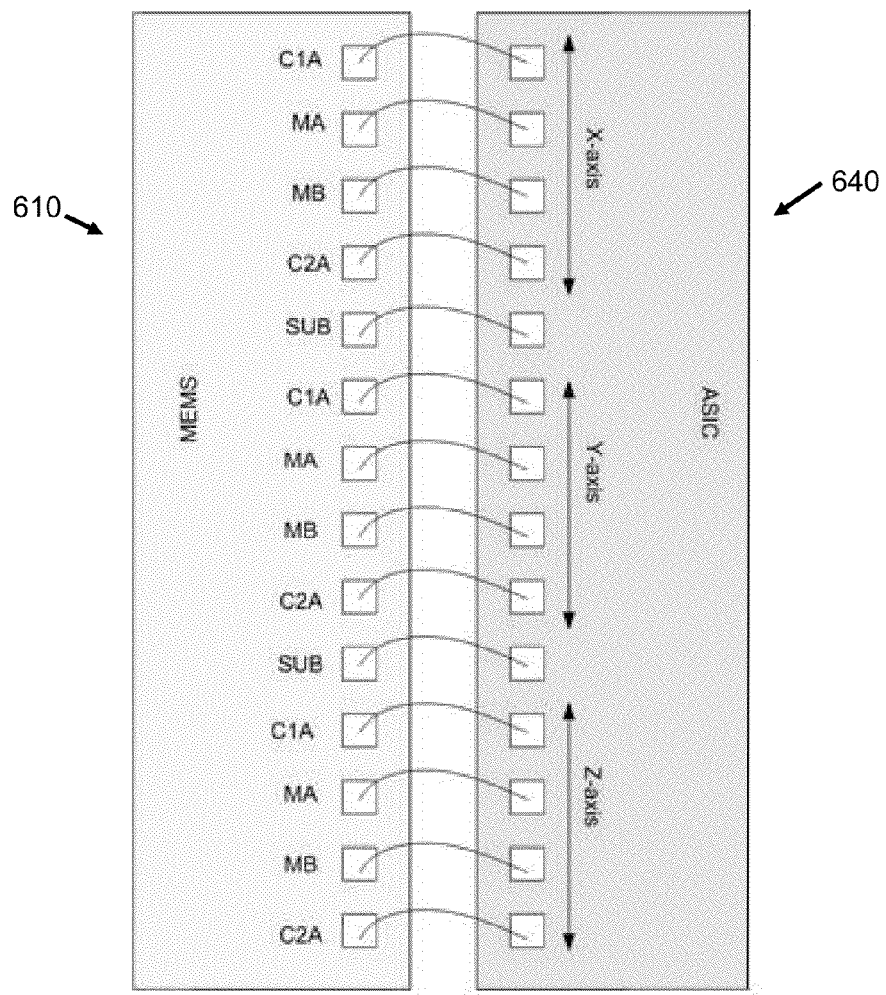
FIG. 6 illustrates the bond wire connections between a MEMS device and an ASIC for a 3-axis (X, Y, Z) pseudo-differential accelerometer.

Using the dummy ASIC capacitor 550 on the ASIC 540 in place of a capacitive core on the MEMS device 510 significantly reduces the number of required bonding pads. FIG. 6 illustrates the bond wire connections between a MEMS device 610 and an ASIC 640 for a 3-axis (X, Y, Z) pseudo-differential accelerometer. The illustrated 3-axis pseudo-differential accelerometer requires fourteen (14) bonding pads which is 30% less than the number of bonding pads required by a fully differential accelerometer as illustrated in FIG. 4. If the electromagnetic rejection requirement is not constraining, then the dummy pad 512 and dummy bond wire 522 can be eliminated which brings the required number of boning pads down to eleven (11) for a 3-axis (X, Y, Z) pseudo-differential accelerometer.

Figure 7A:
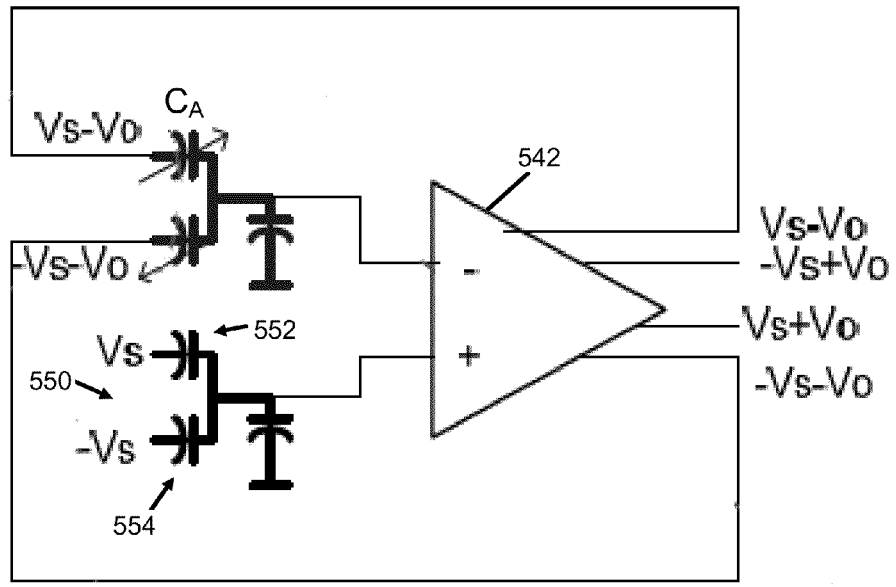
FIG. 7A illustrates the connections made by the chopper systems of the exemplary pseudo-differential accelerometer of FIG. 5 during an exemplary chop state 0.
Figure 7B:
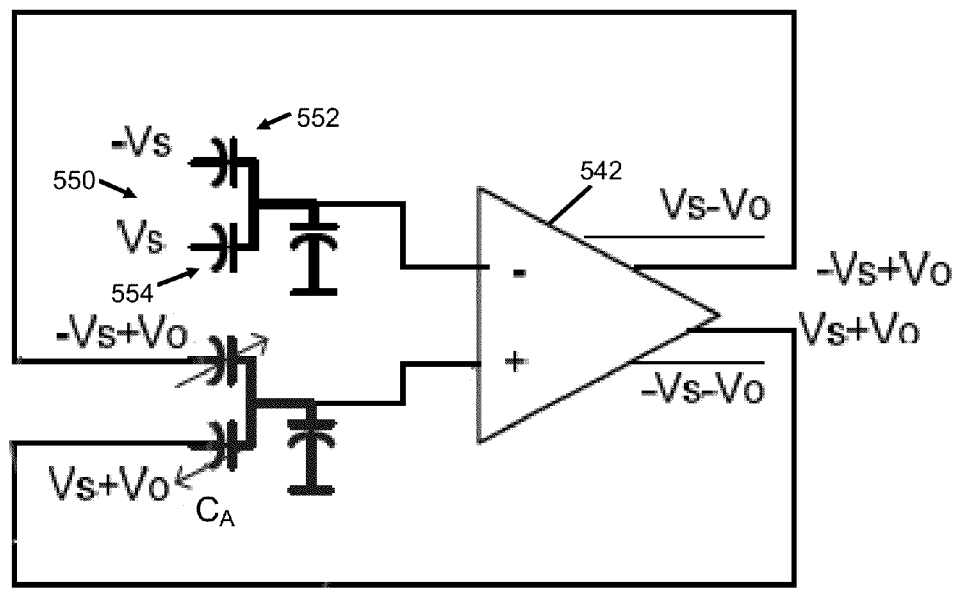
FIG. 7B illustrates the connections made by the chopper systems of the exemplary pseudo-differential accelerometer of FIG. 5 during an exemplary chop state 1.

The chopper systems 544, 546, 548 can swap the signals according to fixed and random patterns to significantly reduce electromagnetic interference from external sources, and maintain a substantially zero average voltage across the sensor capacitors. The chopper systems 544, 546, 548 can switch between two states based on a certain shaped pseudo-random pattern. FIGS. 7A and 7B illustrate exemplary chop states for the exemplary pseudo-differential accelerometer 500.

FIG. 7A illustrates the connections made by chopper systems 544, 546, 548 of the exemplary pseudo-differential accelerometer 500 during an exemplary chop state 0. In chop state 0, the first chopper system 544 connects the signal from the MEMS capacitive core $C_A$ on the core bond wire 521 to the inverted input of the amplifier 542 and connects the combined signals from the dummy ASIC core 550 and from the dummy pad 512 on the dummy bond wire 522 to the non-inverted input of the amplifier 542. In chop state 0, the second chopper system 546 connects the feedback signals with the inverted amplifier output, $V_S-V_O$ and $-V_S-V_O$, to the feedback bond wires 523, 524 to be fed back to the MEMS capacitive core $C_A$. In chop state 0, the third chopper system 548 connects the non-inverted reference voltage, $V_S$, to the dummy sensor capacitor 552 and connects the inverted reference voltage, $-V_S$, to the dummy sensor capacitor 554.

FIG. 7B illustrates the connections made by chopper systems 544, 546, 548 of the exemplary pseudo-differential accelerometer 500 during an exemplary chop state 1. In chop state 1, the first chopper system 544 connects the signal from the MEMS capacitive core $C_A$ on the core bond wire 521 to the non-inverted input of the amplifier 542 and connects the combined signals from the dummy ASIC core 550 and from the dummy pad 512 on the dummy bond wire 522 to the inverted input of the amplifier 542. In chop state 1, the second chopper system 546 connects the feedback signals with the non-inverted amplifier output, $-V_S+V_O$ and $V_S+V_O$, to the feedback bond wires 523, 524 to be fed back to the MEMS capacitive core $C_A$. In chop state 1, the third chopper system 548 connects the inverted reference voltage, $-V_S$, to the dummy sensor capacitor 552 and connects the non-inverted reference voltage, $V_S$, to the dummy sensor capacitor 554.

In the exemplary chopping method, the system can alternate between the chop 0 state (FIG. 7A) and the chop 1 state (FIG. 7B) based on a certain shaped pseudo-random pattern. The voltages used to excite the sensor core $C_A$ and the dummy sensor 550 have opposite polarity in the two chop phases. By moving the sensor core $C_A$ between the inverting and non-inverting inputs of the differential amplifier 542, a pseudo-differential effect is obtained.

A random chopping pattern can be used to smear an electromagnetic disturbance across a wide frequency range. FIG.

Figure 2:
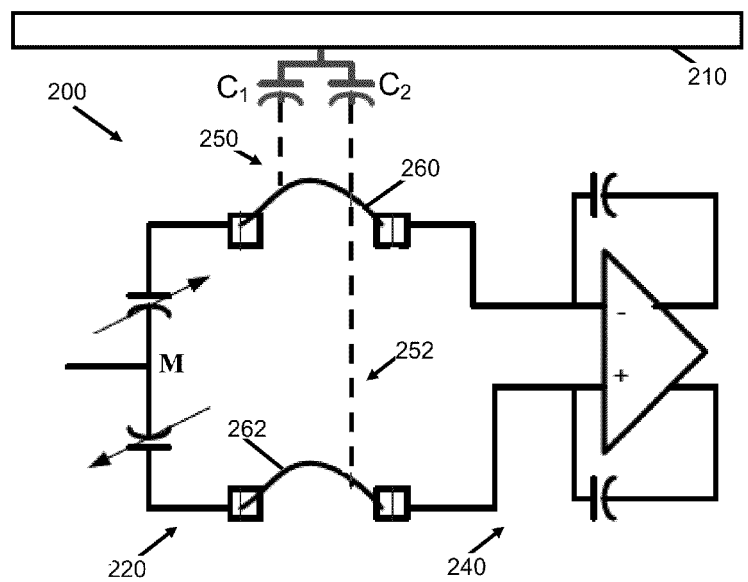
FIG. 2 illustrates a differential approach to overcome electromagnetic disturbances.
Figure 8:
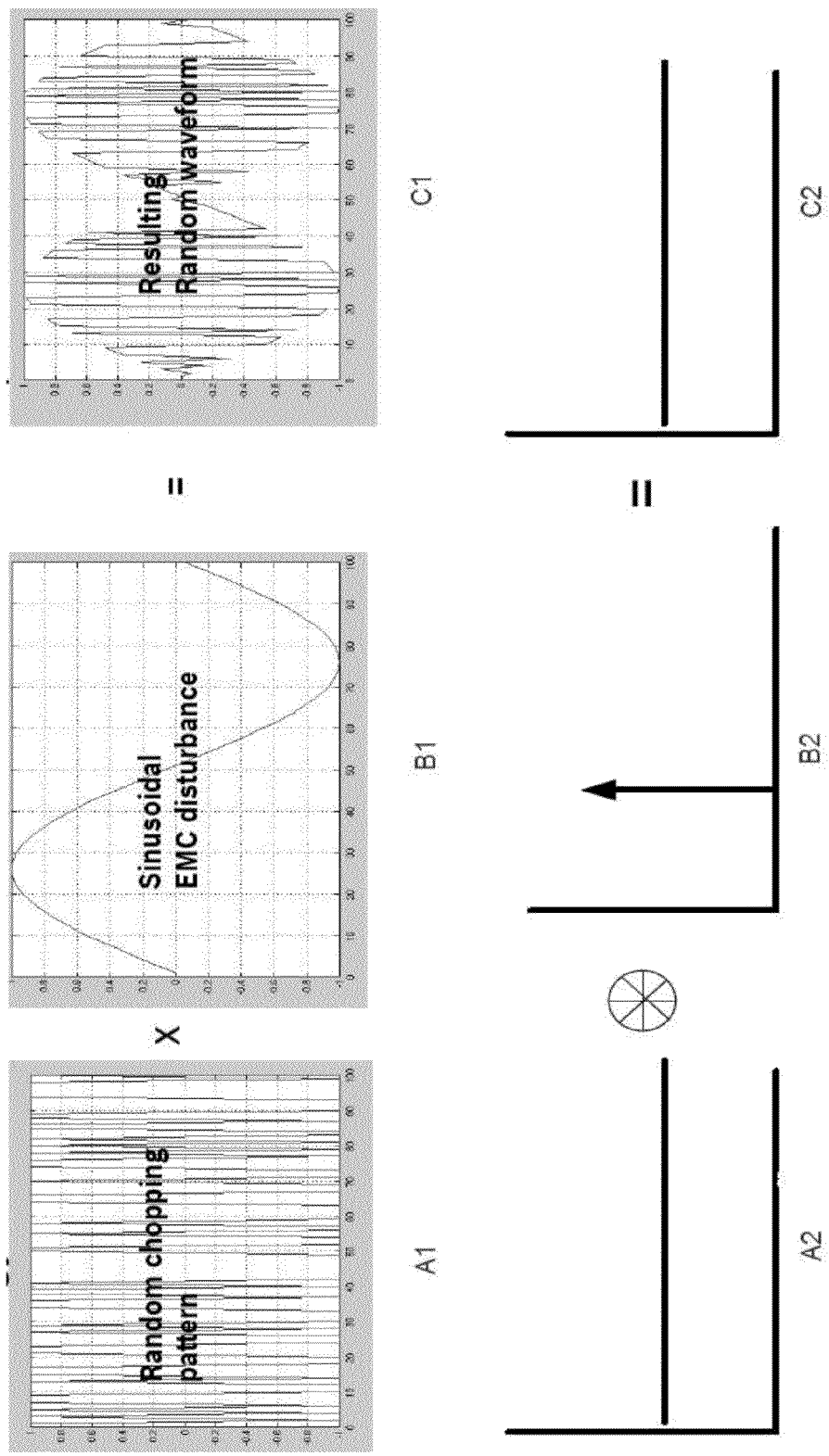
FIG. 8 shows how a chopping pattern can be used to reduce an electromagnetic disturbance by smearing it across a wide frequency range.

8 shows the smearing of the electromagnetic disturbance across a wide frequency range. In FIG. 8, the top plots are in the time domain and the bottom plots are in the frequency domain. FIG. 8A1 shows a random pattern for the chopping signal in the time domain, and FIG. 8A2 shows the random chopping signal spread across a wide range in the frequency domain. The energy of the random chopping pattern is distributed substantially equally across frequencies. FIG. 8B1 shows an exemplary sinusoidal electromagnetic disturbance ($\Delta V_{emc}$) in the time domain, and FIG. 8B2 shows the exemplary electromagnetic disturbance in the frequency domain. The energy of the exemplary electromagnetic disturbance is concentrated at a single frequency. FIG. 8C1 shows the result of combining the random chopping signal with the exemplary electromagnetic disturbance in the time domain, and FIG. 8C2 shows the result of combining these two signals in the frequency domain. The energy of the resulting disturbance signal is smeared substantially equally across a wide frequency range.

This technique can achieve a significant improvement in dealing with electromagnetic disturbances. As shown in FIG. 8, a large electromagnetic disturbance at a single frequency can be distributed across a wide frequency range. For example, by using a clock frequency of 1 MHz and a desired bandwidth of 50 Hz, this technique provides an improvement in electromagnetic robustness of 10 log (1 MHz/(50 Hz*2)) =40 dB which is a significant benefit.

The shape of a chopping pattern can be selected to achieve the right compromise between EMI robustness and tolerance to MEMS non-idealities. In some cases, a flat spectrum chopping sequence like that shown in FIGS. 8A1 and 8A2 may not be the best choice. For example, if due to sensor non-idealities (for example parasitic capacitances), the offsets in the low and high phases of the chop signal are different, then it may be better to use a shaped chopping sequence. Plain random chopping smears the offset difference as white noise which puts some noise around DC and raises the noise floor. A shaped chopping sequence can be used to smear the noise away from a particular frequency band. For example, if the frequency band of interest is at DC or low frequencies, a shaped chopping sequence can be used that smears the noise to higher frequencies.

Figure 9:
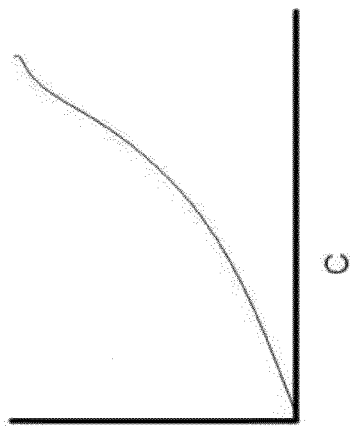
FIG. 9 shows how a shaped chopping pattern can be used to smear the error due to the offset difference in the two chop states away from DC as shaped noise.
Figure 9:
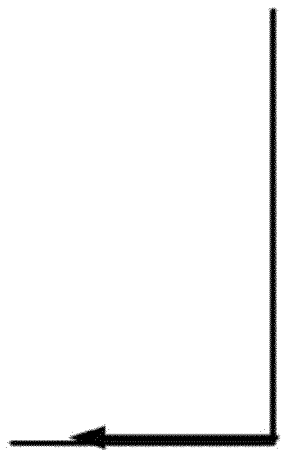
Figure 9:
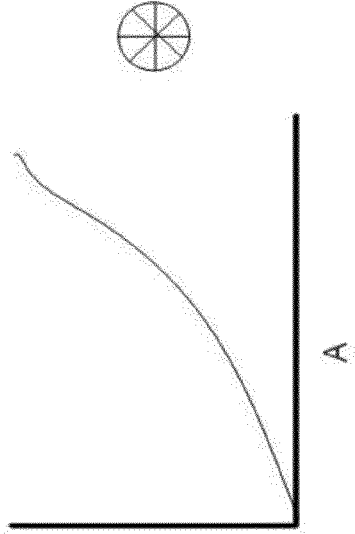

FIG. 9 shows how a shaped chopping pattern can be used to smear the error due to the offset difference in the two chop states away from DC as shaped noise. FIG. 9A shows a chopping pattern in the frequency domain. The chopping pattern has substantially no DC or low frequency component and starts ramping up at higher frequencies. FIG. 9B shows an exemplary DC error due to a difference in the offsets between the chop states. FIG. 9C shows the result in the frequency domain of combining the shaped chopping pattern of FIG. 9A with the exemplary DC error due to the offset difference of FIG. 9B. The error in output due to the offset difference is shaped as noise away from DC and low frequencies, the frequency band of interest, and into higher frequencies.

Figure 10:
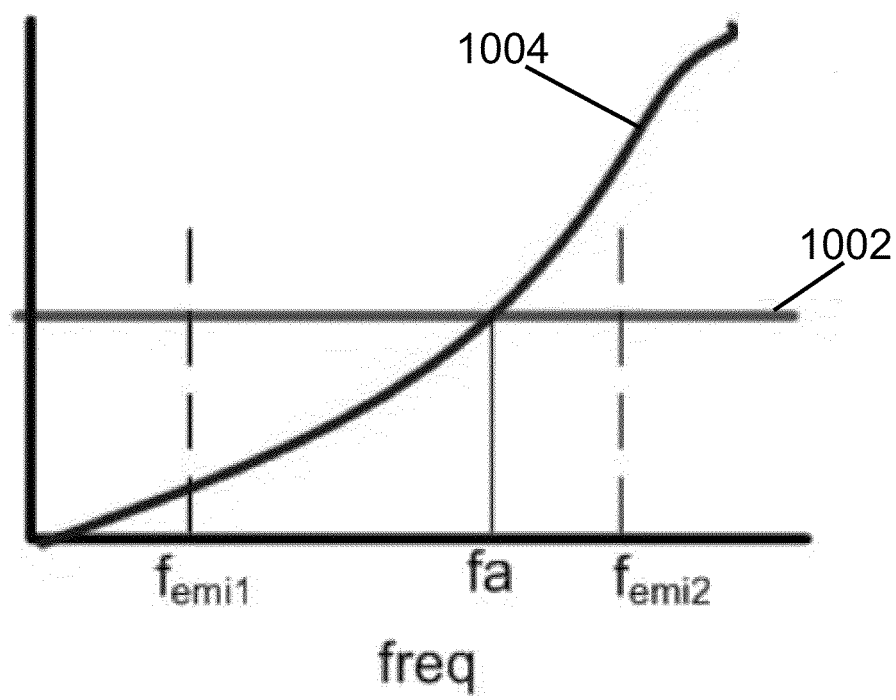
FIG. 10 shows a potential tradeoff between a shaped chopping pattern and an unshaped random pattern.

However, the use of a shaped pattern can result in slightly more EMI induced disturbance for certain EMI frequencies. FIG. 10 illustrates the potential tradeoff between a shaped chopping pattern and an unshaped random pattern. FIG. 10 shows the frequency spectrum of an unshaped random chopping pattern 1002 and of an exemplary shaped chopping pattern 1004. If the aliased EMI frequency is less than frequency fa, for example at frequency $f_{emi1}$, then the shaped pattern 1004 folds less noise onto DC than the unshaped pattern 1002. However, if the aliased EMI frequency is greater than frequency fa, for example at frequency $f_{emi2}$, then the unshaped pattern 1002 folds less noise onto DC than the shaped pattern 1004. System level considerations can be used to decide the desired chopping pattern.

Figure 11A:
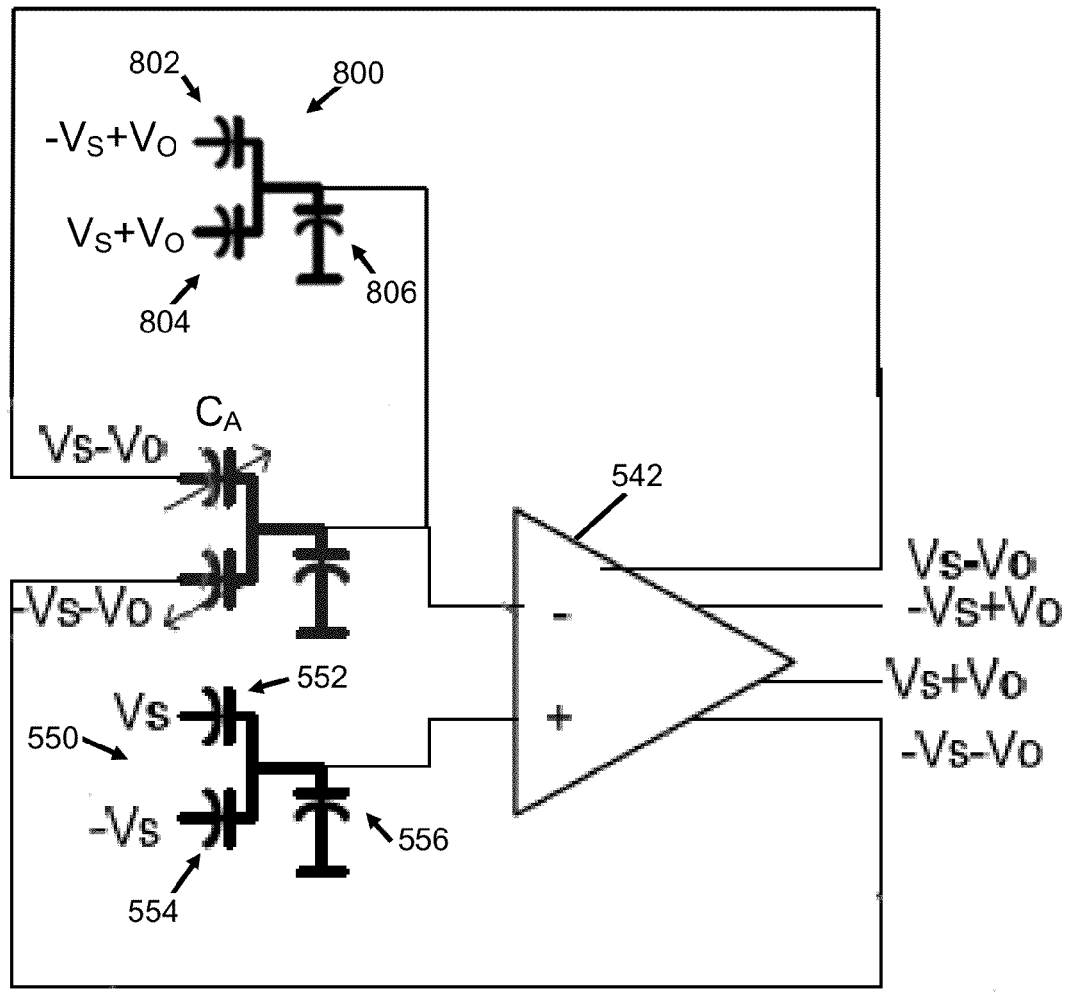
FIG. 11A illustrates the connections made by the chopper systems of the exemplary pseudo-differential accelerometer of FIG. 5 with a neutralization core during an exemplary chop state 0.
Figure 11B:
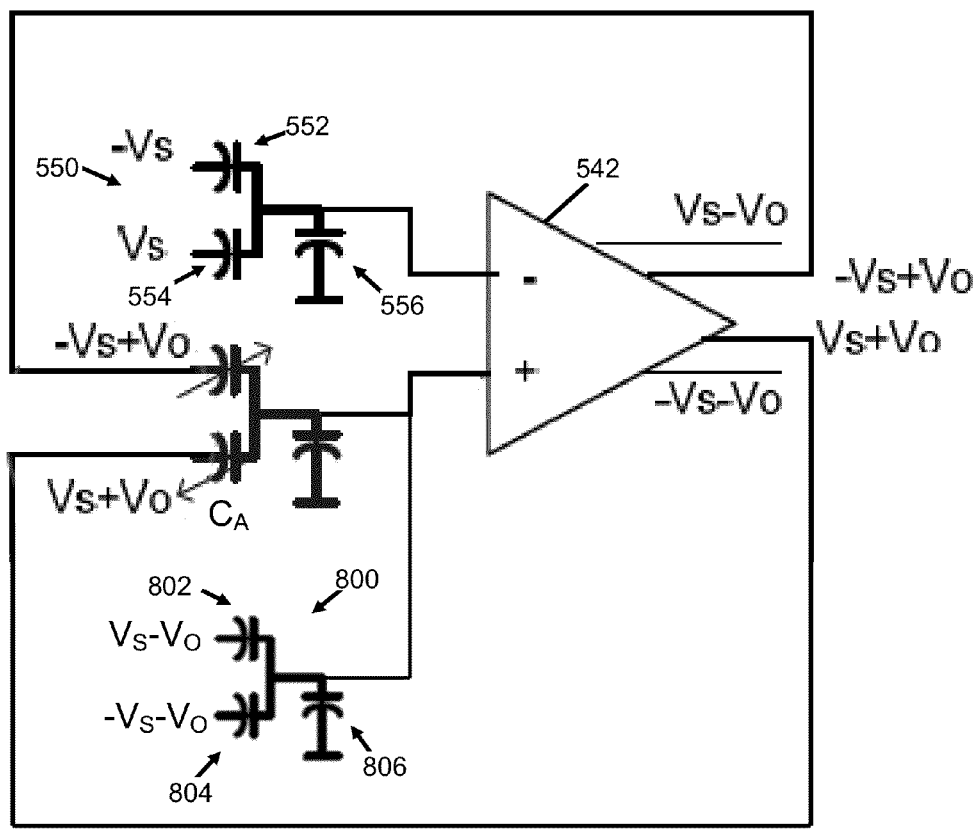
FIG. 11B illustrates the connections made by the chopper systems of the exemplary pseudo-differential accelerometer of FIG. 5 with a neutralization core during an exemplary chop state 1.

Feedthrough capacitance can be a dominant source of non-linearity in an accelerometer. Feedthrough capacitance can cause vibration induced offset drift. A neutralization core can be implemented on the ASIC, such as ASIC 540 of the exemplary pseudo-differential accelerometer 500 shown in FIG. 5, to neutralize the feedthrough capacitance. FIGS. 11A and 11B illustrate an exemplary implementation of a neutralization core 800 during chop states 0 and 1. The neutralization core 800 includes dummy sensor capacitors 802, 804 and a dummy parasitic capacitor 806. The neutralization core 800 is preferably implemented on the ASIC 540 and, as shown in FIGS. 11A and 11B, receives the outputs from the second chopper system 546 that are not being put on the bond wires 523, 524 and sent to the sensor core $C_A$. Thus, the neutralization core 800 receives the opposite voltages as the sensor core $C_A$.

FIG. 11A illustrates the connections made by chopper systems 544, 546, 548 of the exemplary pseudo-differential accelerometer 500 with the neutralization core 800 during an exemplary chop state 0. In chop state 0, the first chopper system 544 connects the combined signals from the MEMS capacitive core $C_A$ on the core bond wire 521 and from the neutralization core 800 to the inverted input of the amplifier 542, and connects the combined signals from the dummy ASIC core 550 and from the dummy pad 512 on the dummy bond wire 522 to the non-inverted input of the amplifier 542. In chop state 0, the second chopper system 546 connects the feedback signals with the inverted amplifier output, $V_S-V_O$ and $-V_S-V_O$, to the feedback bond wires 523, 524 to be fed to the MEMS capacitive core $C_A$. In chop state 0, the second chopper system 546 also connects the feedback signals with the non-inverted amplifier output, $-V_S+V_O$ and $V_S+V_O$, to the sensor capacitors 802, 804 of the neutralization core 800. In chop state 0, the third chopper system 548 connects the non-inverted reference voltage, $V_S$, to the dummy sensor capacitor 552 and connects the inverted reference voltage, $-V_S$, to the dummy sensor capacitor 554.

FIG. 11B illustrates the connections made by chopper systems 544, 546, 548 of the exemplary pseudo-differential accelerometer 500 with the neutralization core 800 during an exemplary chop state 1. In chop state 1, the first chopper system 544 connects the combined signals from the MEMS capacitive core $C_A$ on the core bond wire 521 and from the neutralization core 800 to the non-inverted input of the amplifier 542, and connects the combined signals from the dummy ASIC core 550 and from the dummy pad 512 on the dummy bond wire 522 to the inverted input of the amplifier 542. In chop state 1, the second chopper system 546 connects the feedback signals with the non-inverted amplifier output, $-V_S+V_O$ and $V_S+V_O$, to the feedback bond wires 523, 524 to be fed to the MEMS capacitive core $C_A$. In chop state 1, the second chopper system 546 also connects the feedback signals with the inverted amplifier output, $V_S-V_O$ and $-V_S-V_O$, to the sensor capacitors 802, 804 of the neutralization core 800. In chop state 1, the third chopper system 548 connects the inverted reference voltage, $-V_S$, to the dummy sensor capacitor 552 and connects the non-inverted reference voltage, $V_S$, to the dummy sensor capacitor 554.

While this invention has been described as having an exemplary design, the present invention may be further modified within the spirit and scope of this disclosure. This application is therefore intended to cover any variations, uses, or adaptations of the invention using its general principles.

We claim:

1. A pseudo-differential accelerometer resistant to electromagnetic interference, the pseudo-differential accelerometer comprising:
   a microelectromechanical device including a capacitive sensor core having a first sensor core input, a second sensor core input and a sensor core output;
   an integrated circuit including a chopper system, a differential amplifier, a dummy core and a reference voltage, the integrated circuit being coupled to the microelectromechanical device by bond wires;
      the differential amplifier including an inverting input, a non-inverting input and producing an amplifier output voltage;
      the chopper system having a plurality of chopper inputs and a plurality of chopper outputs wherein during a chop state 0 the chopper system connects a first set of the plurality of chopper inputs to a first set of the plurality of chopper outputs and during a chop state 1 the chopper system connects a second set of the plurality of chopper inputs to a second set of the plurality of chopper outputs;
      the dummy core being coupled to a dummy core chopper input of the chopper system;
   a sensor core bond wire coupling the sensor core output of the capacitive sensor core to a sensor core chopper input of the chopper system;
   a first feedback bond wire coupling a first feedback signal to the first sensor core input of the capacitive sensor core, the first feedback bond wire being coupled to a first chopper feedback output; and
   a second feedback bond wire coupling a second feedback signal to the second sensor core input of the capacitive sensor core, the second feedback bond wire being coupled to a second chopper feedback output;
   wherein when the chopper system is in the chop state 0, the chopper system connects the sensor core chopper input to the inverting input of the differential amplifier, connects the dummy core chopper input to the non-inverting input of the differential amplifier, connects the first chopper feedback output to a difference of the amplifier output and reference voltages, connects the second chopper feedback output to a sum of the amplifier output and reference voltages; and
   when the chopper system is in the chop state 1, the chopper system connects the sensor core chopper input to the non-inverting input of the differential amplifier, connects the dummy, core chopper input to the inverting input of the differential amplifier, connects the first chopper feedback output to the inverse of the difference of the amplifier output and reference voltages, connects the second chopper feedback output to the inverse of the sum of the amplifier output and reference voltages, the inverse of the difference of the amplifier output and reference voltages having the same magnitude and opposite polarity as the difference of the amplifier output and reference voltages, and the inverse of the sum of the amplifier output and reference voltages having the same magnitude and opposite polarity as the sum of the amplifier output and reference voltages.

2. The pseudo differential accelerometer of claim 1, wherein the dummy core includes a first dummy core input, a second dummy core input and a dummy core output, the dummy core output being coupled to the dummy core chopper input of the chopper system;
   wherein when the chopper system is in the chop state 0, the chopper system connects the reference voltage to the first dummy core input, and connects the inverse reference voltage to the second dummy core input, the inverse reference voltage, having the same magnitude and opposite polarity as the reference voltage, and
   when the chopper system is in the chop state 1, the chopper system connects the inverse reference voltage to the first dummy core input, and connects the reference voltage to the second. dummy core input.

3. The pseudo-differential accelerometer of claim 2, wherein the dummy core includes a first dummy capacitor having a first dummy capacitor input and a first dummy capacitor output, and a second dummy capacitor having a second dummy capacitor input and a second dummy capacitor output, the first dummy capacitor input being the first dummy core input, the second dummy capacitor input being the second dummy core input, and a common node receiving the first and second dummy capacitor outputs being the dummy core output.

4. The pseudo-differential accelerometer of claim 2, wherein the chopper system is varied between the chop state 0 and the chop state 1 at frequencies that smear noise away from a frequency band of interest.

5. The pseudo-differential accelerometer claim 2, wherein the chopper system is varied between the chop state 0 and the chop state 1 at frequencies that smear noise substantially evenly across a wide frequency range.

6. The pseudo-differential accelerometer of claim 2, wherein only the sensor core bond wire, and the first and second feedback bond wires are required to fully connect the capacitive sensor core of the microelectromechanical device to the integrated circuit.

7. The pseudo-differential accelerometer of claim 2, further comprising a neutralization core connected to the sensor core chopper input of the chopper system.

8. The pseudo-differential accelerometer of claim 7, wherein the neutralization core includes a first neutralization core input, a second neutralization core input and a neutralization core output, the neutralization core output being coupled to the sensor core chopper input of the chopper system;
   wherein when the chopper system is in the chop state 0, the chopper system connects the first neutralization core input to the inverse of the difference of the amplifier output and reference voltages, connects the second neutralization core input to the inverse of the sum of the amplifier output and reference voltages; and
   when the chopper system is in the chop state 1, the chopper system connects the first neutralization core input to a difference of the amplifier output and reference voltages, connects the second neutralization core input to a sum of the amplifier output and reference voltages.

9. The pseudo-differential accelerometer of claim 8, wherein the neutralization core includes a first neutralization capacitor having a first neutralization capacitor input and a first neutralization capacitor output, and a second neutralization capacitor having a second neutralization capacitor input and a second neutralization capacitor output, the first neutralization capacitor input being the first neutralization core input, the second neutralization capacitor input being the second neutralization core input, and a common node receiving the first and second neutralization capacitor outputs being the neutralization core output.

10. The pseudo-differential accelerometer of claim 8, wherein only the sensor core bond wire, and the first and second feedback bond wires are required to fully connect the capacitive sensor core of the microelectromechanical device to the integrated circuit.

11. The pseudo-differential accelerometer of claim 1, further comprising a dummy bond wire, and wherein the microelectromechanical device further includes a dummy pad, the dummy bond wire connecting the dummy pad to the dummy core chopper input.

12. The pseudo-differential accelerometer of claim 11, wherein the dummy core includes a first dummy core input, a second dummy core input and a dummy core output, the dummy core output being coupled to the dummy core chopper input of the chopper system;
   wherein When the chopper system is in the chop state 0, the chopper system connects the reference voltage to the first dummy core input, and connects the inverse reference voltage to the second dummy core input, the inverse reference voltage having the same magnitude and opposite polarity as the reference voltage, and
   when the chopper system is in the chop state 1, the chopper system connects the inverse reference voltage to the first dummy core input, and connects the reference voltage to the second dummy core input.

13. The pseudo-differential accelerometer of claim 12, wherein the dummy core includes a first dummy capacitor having a first dummy capacitor input and a first dummy capacitor output, and a second dummy capacitor having a second dummy capacitor input and a second dummy capacitor output, the first dummy capacitor input being the first dummy core input, the second dummy capacitor input being the second dummy core input, and a common node receiving the first and second dummy capacitor outputs being the dummy core output.

14. The pseudo-differential accelerometer of claim 12, wherein the chopper system is varied between the chop state 0 and the chop state 1 at frequencies that smear noise away from a frequency band of interest.

15. The pseudo-differential accelerometer of claim 12, wherein the chopper system is varied between the chop state 0 and the chop state 1 at frequencies that smear noise substantially evenly across a wide frequency range.

16. The pseudo-differential accelerometer of claim 12, wherein only the sensor core bond wire, the dummy bond wire, and the first and second feedback bond wires are required to fully connect the capacitive sensor core of the microelectromechanical device to the integrated circuit.

17. The pseudo-differential accelerometer of claim 12, further comprising a neutralization core connected to the sensor core chopper input of the chopper system.

18. The pseudo-differential accelerometer of claim 17, wherein the neutralization core includes a first neutralization core input, a second neutralization core input and a neutralization core output, the neutralization core output being coupled to the sensor core chopper input of the chopper system;
   wherein when the chopper system is in the chop state 0, the chopper system connects the first neutralization core input to the inverse of the difference of the amplifier output and reference voltages, and connects the second neutralization core input to the inverse of the sum of the amplifier output and reference voltages; and
   when the chopper system is in the chop state 1, the chopper system connects the first neutralization core input to a difference of the amplifier output and reference voltages, and connects the second neutralization core input to a sum of the amplifier output and reference voltages.

19. The pseudo-differential accelerometer of claim 18, wherein the neutralization core includes a first neutralization capacitor having a first neutralization capacitor input and a first neutralization capacitor output, and a second neutralization capacitor having a second neutralization capacitor input and a second neutralization capacitor output, the first neutralization capacitor input being the first neutralization core input, the second neutralization capacitor input being the second neutralization core input, and a common node receiving the first and second neutralization capacitor outputs being the neutralization core output.

20. The pseudo-differential accelerometer of claim 18, wherein only the sensor core bond wire, the dummy bond wire, and the first and second feedback bond wires are required to fully connect the capacitive sensor core of the microelectromechanical device to the integrated circuit.

* * * * *